United States Patent [19]
Van Damme et al.

[11] Patent Number: 5,506,085
[45] Date of Patent: Apr. 9, 1996

[54] THERMAL IMAGING ELEMENT

[75] Inventors: Marc Van Damme, Heverlee; Joan Vermeersch, Deinze; Johan Lamotte, Leuven, all of Belgium; Oskar Nuyken; Brigitte Voit, both of München, Germany; Armin Lang, Grosseisenbach, Germany; Cliff Scherer; Andreas Baindl, both of München, Germany; Jürgen Stebani, Krefeld, Germany; Alexander Wokaun, Endingen, Switzerland; Andrej Stasko, Bratislava, Slovakia

[73] Assignee: AGFA-Gevaert N.V., Mortsel, Belgium

[21] Appl. No.: 442,828

[22] Filed: May 17, 1995

[30]     Foreign Application Priority Data

Oct. 13, 1994 [EP] European Pat. Off. ............... 9420978

[51] Int. Cl.⁶ .................................................. G03C 1/76
[52] U.S. Cl. ........................... 430/200; 430/203; 503/227
[58] Field of Search ..................................... 430/200, 203; 503/227

[56]           References Cited

U.S. PATENT DOCUMENTS

| 4,788,128 | 11/1988 | Barlow | 430/200 |
| 5,122,502 | 6/1992 | Bowman et al. | 503/227 |
| 5,210,067 | 5/1993 | Egashira et al. | 503/227 |

FOREIGN PATENT DOCUMENTS

| 528074 | 2/1993 | European Pat. Off. | 503/227 |
| 573084 | 12/1993 | European Pat. Off. | 503/227 |
| 4229295 | 8/1992 | Japan | 503/227 |

*Primary Examiner*—Hoa V. Le
*Attorney, Agent, or Firm*—Brumbaugh, Graves, Donohue & Raymond

[57]           ABSTRACT

A new type of thermal imaging element containing a thermally degradable polymer and a radiation to heat converting substance is disclosed. The invention further comprises several methods for the formation of a heat mode image after image-wise exposure of the thermal imaging element to intense laser radiation.

10 Claims, No Drawings

THERMAL IMAGING ELEMENT

DESCRIPTION

1. Field of the Invention

The present invention relates to a new type of heat mode recording material.

2. Background of the Invention

Conventional photographic materials based on silver halide are used for a large variety of applications. For instance, in the pre-press sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view. E.g. the commonly used developing agent hydroquinone is a rather unwanted ingredient because of its allergenic effects. The biodegradation of disposed Phenidone is too slow. Sulphite ions show a high COD (Chemical Oxygen Demand) and the resulting sulphate ions are harmful for e.g. concrete. As a consequence it is undesirable that depleted solutions of this kind would be discharged into the public sewerage; they have to be collected and destroyed by combustion, a cumbersome and expensive process.

In the past several proposals have been made for obtaining an imaging element that can be developed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts.

Another type of non-conventional materials as alternative for silver halide is constituted by so-called photo mode materials based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc. The thus produced differences may be subsequently employed in a dry treatment step to produce a visible image and/or master for printing e.g. a lithographic or electrostatic printing master.

A difference in solubility between the exposed and non-exposed parts of the photopolymerizable composition is often used for the production of lithographic printing plates where a hydrophilic base is coated with the photopolymerizable composition, subsequently exposed and developed using a solvent to remove the non-exposed or insufficiently exposed parts. Such a process is for example described in "Unconventional imaging processes" by E. Brinckman, G. Delzenne, A. Poor and J. Willems, Focal Press London-New York, first edition 1978, pages 33 to 39.

The use of the difference in tackiness to obtain an image is described in e.g. U.S. Pat. No. 3,060,024, 3,085,488 and 3,649,268. According to the method disclosed in these U.S. patent applications the image-wise exposed photopolymerizable composition looses its tackiness in the exposed parts while the non-exposed parts keep their tackiness. The non-exposed parts can therefore be coloured with dry dye pigments to make the image visible.

As a further alternative for silver halide chemistry dry imaging elements are known that can be image-wise exposed using an image-wise distribution of heat. These types of dry imaging elements called heat mode materials (or thermal imaging materials, thermal recording materials or thermographic materials) offer the advantage in addition to an ecological advantage that they do not need to be handled in a dark room nor any other protection from ambient light is needed. Heat mode recording materials, based on change of adhesion, are disclosed in e.g. U.S. Pat. Nos. 4,123,309, 4,123,578, 4,157,412, 4,547,456 and PCT applications WO 88/04237 and WO 93/03928.

In still another type of heat mode recording materials information is recorded by creating differences in reflection and/or in transmission optical density on the recording layer. The recording layer has high optical density and absorbs radiation beams which impinge thereon. The conversion of radiation into heat brings about a local temperature rise, causing a thermal change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346). In a preferred embodiment the recording layer of such heat mode recording materials is made of a metal, e.g. bismuth.

The present invention further extents the teachings on heat mode materials.

It is an object of the present invention to provide a new type of thermal imaging element.

It is a further object of the present invention to provide methods for the formation of a heat mode image involving no wet processing steps in several embodiments.

SUMMARY OF THE INVENTION

The objects of the present invention are realized by providing a thermal imaging element, comprising a support and at least one layer containing a radiation to heat converting substance, preferably an infra-red absorbing compound, and a thermally degradable polymer composed of recurring units corresponding to one of the following formulas (I) to (V):

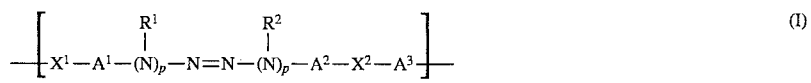

(I)

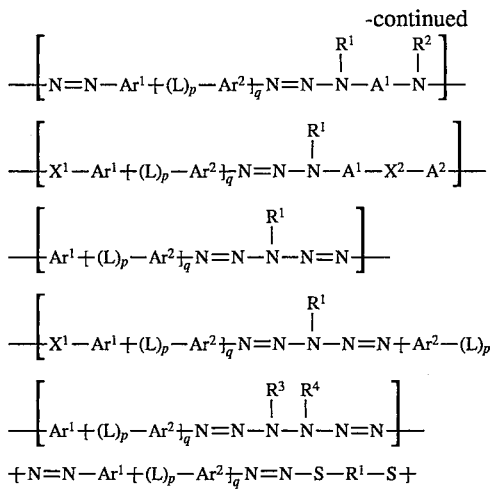

$$-\left[N=N-Ar^1+(L)_p-Ar^2\right]_q N=N-\underset{R^1}{\underset{|}{N}}-\underset{R^2}{\underset{|}{N}}-A^1-N\right]- \quad \text{(IIa)}$$

$$-\left[X^1-Ar^1+(L)_p-Ar^2\right]_q N=N-\underset{R^1}{\underset{|}{N}}-A^1-X^2-A^2\right]- \quad \text{(IIb)}$$

$$-\left[Ar^1+(L)_p-Ar^2\right]_q N=N-\underset{R^1}{\underset{|}{N}}-N=N\right]- \quad \text{(IIIa)}$$

$$-\left[X^1-Ar^1+(L)_p-Ar^2\right]_q N=N-\underset{R^1}{\underset{|}{N}}-N=N+Ar^2-(L)_p\right]_q Ar^1-X^2-A^1\right]- \quad \text{(IIIb)}$$

$$-\left[Ar^1+(L)_p-Ar^2\right]_q N=N-\underset{R^3}{\underset{|}{N}}-\underset{R^4}{\underset{|}{N}}-N=N\right]- \quad \text{(IV)}$$

$$+N=N-Ar^1+(L)_p-Ar^2\right]_q N=N-S-R^1-S+ \quad \text{(V)}$$

The symbols used in these formulas will be explained in the description hereinafter.

The present invention further comprises several methods for the formation of a heat mode image. These methods include a laser exposure, and a wash-off treatment, a peel-apart treatment, a rub off treatment or a material transfer step. Each of these methods will be explained in detail furtheron.

DETAILED DESCRIPTION OF THE INVENTION

As support for the thermal imaging element of the present invention preferably a transparent organic resin support is used. This can be chosen from, e.g., cellulose nitrate film, cellulose acetate film, polyvinyl acetal film, polystyrene film, polyethylene terephthalate film (PET), a polyethylene naphthalate film, polycarbonate film, polyvinylchloride film or poly-α-olefin films such as polyethylene or polypropylene film. The thickness of such organic resin film is preferably comprised between 0.05 and 0.35 mm. These organic resin supports are preferably coated with a subbing layer. The most preferred transparent support is a polyethylene terephthalate support.

In the present invention the thermal imaging element contains in at least one layer a thermally degradable polymer and a radiation to heat converting substance as main ingredients.

In a first embodiment the thermally degradable polymer is composed of recurring units containing an azo-group or a tetrazene group in the main chain according to the following general formula (I):

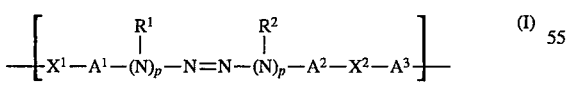

$$-\left[X^1-A^1-(N)_p-N=N-(N)_p-A^2-X^2-A^3\right]- \quad \text{(I)}$$

wherein,
each of $A^1$, $A^2$ and $A^3$ independently represents optionally substituted alkylene or optionally substituted arylene,
each of $R^1$ and $R^2$ independently represents H, optionally substituted alkylene, or optionally substituted arylene,
each of $X^1$ and $X^2$ independently represents a divalent linking group chosen from the group consisting of —NHCO—, —CONH—, —OCO—, —S—, —NH-CONH—, —NHCOO—, —OCONH—, —O—, and p=0 or 1.

In case p=0, the recurring unit contains an azo group. Such polymers can be synthesized via polycondensation reactions and polymerization through azo group formation as described in "Azo functional polymers" G. Sudesh Kumar—Technomic Publishing Co.—Basel. An example of the preparation of such an azo containing condensation polymer is given in: O. Nuyken, J. Dauth, J. Stebani, *Angew. Makromol Chem.*, 207, 65, (1993).

In case p=1, the recurring unit contains a tetrazene group. Literature on tetrazene chemistry can be found in the following references: C. Süling, "Herstellung von aromatischen Tetrazenen, Pentazadienen und höheren Azahomologen" in "Methoden der Organischen Chemie" (Houben-Weyl) 10/3, 733, G. Thieme Verlag, 4. Aufl., Stuttgart (1965), E. Muller, "Herstellung aliphatischer Tetrazene" in "Methoden der Organischen Chemie" (Houben-Weyl) 10/2, 828, G. Thieme Verlag, 4. Aufl., Stuttgart (1967), S. Lang-Fugmann, "Tetrazene und ihre höheren Homologen" in "Methoden der Organischen Chemie" (Houben-Weyl) E16a, 1227, G. Thieme Verlag, 4. Aufl., Stuttgart (1990).

In a second embodiment the thermally degradable polymer is composed of recurring units containing a triazene group in the main chain according to the following formulas (IIa) or (IIb):

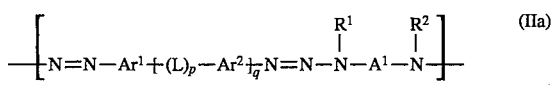

$$-\left[N=N-Ar^1+(L)_p-Ar^2\right]_q N=N-\underset{R^1}{\underset{|}{N}}-\underset{R^2}{\underset{|}{N}}-A^1-N\right]- \quad \text{(IIa)}$$

wherein,
each of $Ar^1$ and $Ar^2$ independently represents an optionally substituted aromatic group,
L represents a divalent linking group chosen from the group consisting of —O—, —S—, —CO—, —SO—, $CZ^1Z^2$ wherein each of $Z^1$ and $Z^2$ independently represents H, alkyl or the necessary atoms to close a cycloaliphatic ring,
q=0 or 1, and the other symbols have the same meaning as in formula (I).

These polymers according to (IIa) can be prepared by a polycondensation reaction of difunctional diazonium monomers with diamines. An example of the preparation of such triazene containing polymers is given in: O. Nuyken, J. Stebani, T. Lippert, A. Wokaun, *Makromol. Chem. Rapid. Commun.*, 14,365 (1993).

The triazene containing polymers can also be prepared by polycondensation of low weight compounds already containing the triazene group. In this case the polymer is composed of recurring units containing a triazene group according to the following structure (IIb):

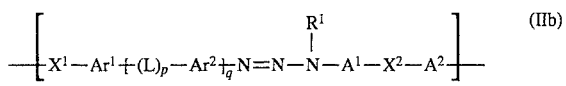

According to a third embodiment the thermally degradable polymer is composed of recurring units containing a pentazadiene group according to the following formulas (IIIa) or (IIIb):

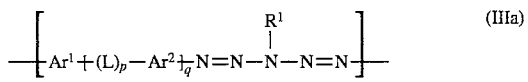

wherein the symbols have the same meaning as in the preceding formulas (I) and (IIa).

These polymers can be prepared by a polycondensation reaction of difunctional diazonium monomers with alkyl- or arylamines. The synthesis of such a polymer is described in Diplomarbeit: A. Baindl, 1993, Lehrstuhl fur Makromoleculare Stoffe TCIII, Technische Universitat München. More literature on low molecular weight pentazadienes can be found in the following references:

P. Griess, Liebigs Ann. Chemie, 137, p. 81, (1866),

A. N. Howard, F. Wild, Biochem. J., 65, p. 656, (1957),

M. Busch, N. Patrascu, W. Weber, J. Pt. [2], 140, p. 117, (1934), Phillips Petroleum Co., U.S. Pat. No. 2,530, 497, O. Dimroth, M. Eble, W. Gruhl, Chem. Ber., 40, p. 2390, (1907), H. Goldschmidt, V. Badl, Chem. Ber., 22, p. 934, (1889), H. v. Pechmann, L. Frobenius, Chem. Ber., 27, p. 898, (1894), H. Minato, M. Ibata, H. Iwai, Chem. Abstr., 69, 105656w, (1968), F. R. Benson, "The High Nitrogen Compounds", Ed. Wiley, 196, New York, (1964), J. Hollaender, W. P. Neumann, Angew. Chem., 82,813, (1970).

As for the triazene containing polymers the pentazadiene containing polymers can also be prepared by polycondensation of low molecular weight compounds containing already the pentazadiene group. In this case the polymer is composed of recurring units containing a pentazadiene group according to the following structure (IIIb):

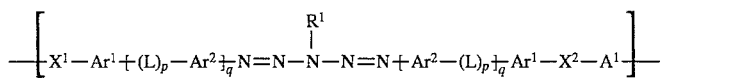

According to a fourth embodiment the thermally degradable polymer is composed of recurring units containing a hexazadiene group according to the following formula (IV)

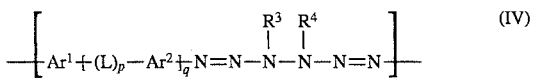

wherein Ar$^1$ Ar$^2$ and (L)$_p$ have the same meaning as in the preceding formulas (IIa), (IIb), (IIIa) and (IIIb), and each of R$^3$ and R$^4$ independently represents H, optionally substituted alkylene, optionally substituted arylene or optionally substituted acylene.

These polymers can be prepared by a polycondensation reaction of difunctional diazonium monomers with N,N-alkyl-, aryl- or acyl substituted hydrazines. The synthesis of such a polymer is described in Diplomarbeit: C. Scherer, 1993, Lehrstuhl fur Makromoleculare Stoffe TCIII, Technische Universitat München.

More literature on low molecular weight hexazadienes can be found in the following references:

C. Süling in "Methoden der org. Chemie, (Houben-Weyl)" X/3, Georg Thieme Verlag, Stuttgart, (1965), p. 740, K. H. Hoffmann, H. Hock, Bet. Dtsch. Chem. Ges., 44, (1911), 2946, J. P. Horwitz, V. A. Grakauskas, J. Am. Chem. Soc., 79, (1957), 1249, W. Teilacker, E. C. Fintelmann, Chem. Ber., 91, (1958), 1557, V. A. Grakauskas, Dissertation, Illinois Institute of Technology, Chicago, (1955), M. Mackay, D. D. McIntyre, N. J. Taylor, J. Org. Chem., 47, (1982), 532.

According to a fifth embodiment the thermally degradable polymer is composed of recurring units containing azosulphide groups according to the following formula (V):

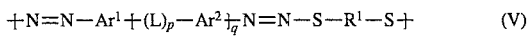

wherein the symbols have the same meaning as in the preceding formulas (I) and (IIa).

These polymers can be prepared by a polycondensation reaction of difunctional diazonium monomers with dimercaptosubstituted monomers. The synthesis of low molecular weight azosulphides is described in the following references:

O. Stadler, Chem. Ber., 17, 2075, (1884),

J. H. Ziegler, Chem. Ber., 23, 2469, (1890),

C. Graebe, O. Schulteβ, Ann. Chem., 263, 1, (1891),

A. Hantzsch, H. Freese, Chem. Ber., 28, 3237, (1895),

C. C. Price, S. Tsunawaki, J. Org. Chem., 28, 1867, (1963),

Preferred examples of thermodegradable polymers include:

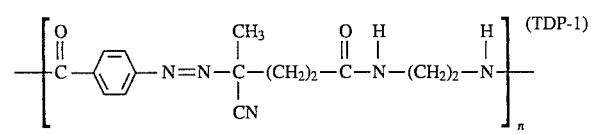

The synthesis of TDP-1 is described in O. Nuyken, J. Dauth, J. Stebani, Angew. Makromol. Chem., 207.65 (1993)

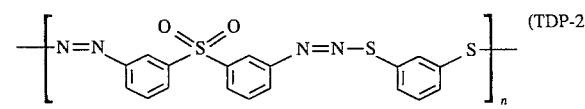

The synthesis of TDP-2 will be described in preparative example

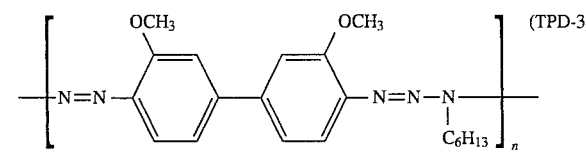

The synthesis of TDP-3 will be described in preparative example 2.

The radiation to heat converting substance present in the heat sensitive layer(s) transforms the information-wise modulated intense laser exposure into an information-wise modulated pattern of heat. In a most preferred embodiment the laser is an infra-red laser and the radiation to heat converting substance is an infra-red absorbing compound. This infra-red absorbing compound can be a soluble infra-red absorbing dye or a dispersable infra-red absorbing pigment. Infra-red absorbing compounds are known since a long time and can belong to several different chemical classes, e.g. indoaniline dyes, oxonol dyes, porphine derivatives, anthraquinone dyes, merostyryl dyes, pyrylium compounds and sqarylium derivatives.

A suitable infra-red dye can be chosen from the numerous disclosures and patent applications in the field, e.g., from U.S. Pat. Nos. 4,886,733, 5,075,205, 5,077,186, 5,153,112, 5,244,771, from Japanese unexamined patent publications (Kokai) Nos 01-253734, 01-253735, 01-253736, 01-293343, 01-234844, 02-3037, 02-4244, 02-127638, 01-227148, 02-165133, 02-110451, 02-234157, 02-223944, 02-108040, 02-259753, 02-187751, 02-68544, 02-167538, 02-201351, 02-201352, 03-23441, 03-10240, 03-10239, 03-13937, 03-96942, 03-217837, 03-135553, 03-235940, and from the European published patent application Nos. 0 483 740, 0 502 508, 0 523 465, 0 539 786, 0 539 978 and 0 568 022. This list is far from exhaustive and limited to rather recent disclosures.

In a preferred embodiment the infra-red dye is chosen from German patent application DE 43 31 162 which discloses infra-red dyes with low side absorptions in the visible and near UV region.

A preferred IR-absorbing compound (IRD-1) is a commercial product known as CYASORB IR165, marketed by American Cyanamid Co, Glendale Protective Technologies Division, Woodbury, N. Y. It is a mixture of two parts of the non-ionic and three parts of the ionic form.

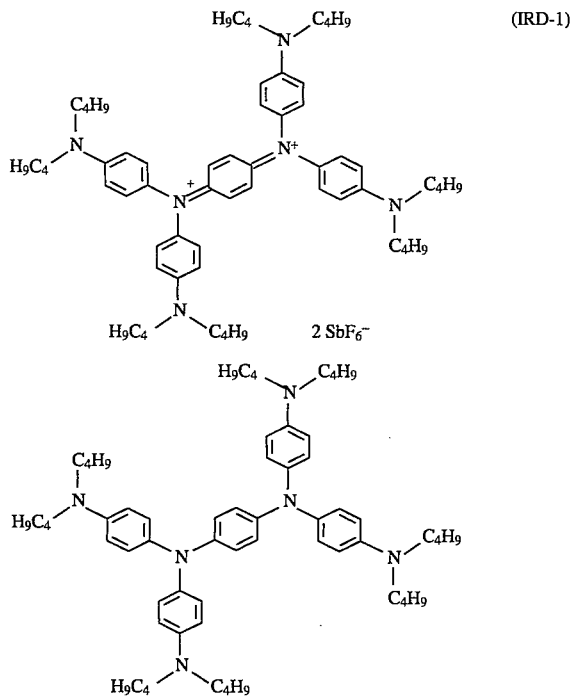

Apart from infra-red dyes, dispersable infra-red absorbing pigments can be used. This pigments can be coloured, e.g. phthalocyanine pigments. However the most preferred pigment is carbon black, absorbing in the infra-red and the visible spectral region. It can be used in the amorphous or in the graphite form. The preferred average particle size of the carbon black ranges from 0.01 to 1 µm. Different commercial types of carbon black can be used, preferably with a very fine average particle size, e.g., RAVEN 5000 ULTRA II (Columbian Carbon Co.), CORAX L6, FARBRUSS FW 200, SPEZIALSCHWARZ 5, SPEZIALSCHWARZ 4A, SPEZIALSCHWARZ 250 and PRINTEX U (all from Degussa Co.).

The thermally degradable polymers used in accordance with the present invention are film forming polymers to be coated from an organic solvent so that no extra binder is required in the heat sensitive layer. In principle, however, an extra binder can be present. This extra binder can be thermodegradable itself as it is the case with e.g. nitrocellulose. Also non-thermodegradable polymers can be used to optimize the physical properties of the heat sensitive layer (cohesive strenght, adhesion to optional adjacent layers, etc.).

The heat sensitive layer(s) can furthermore contain plasticizers, thermal solvents, surfactants, fillers, antiblocking agents, antistatic agents, colorants, surface tension lowering compounds, gas producing low molecular weight compounds ("blowing agents").

For the formation of an image the heat mode element composed according to the description above is information-wise exposed by means of an intense laser beam. Such a laser can be an Ar ion laser, a HeNe laser, a Kr laser, a frequency doubled Nd-YAG laser, a dye laser emitting in the visual spectral region. However in the preferred embodiment where the radiation to heat converting compound is an infra-red absorbing compound the laser is an infra-red laser. Especially preferred lasers are semiconductor diode lasers or solid state lasers such as a Nd-YAG laser emitting at 1064 nm, or a Nd-YLF laser emitting at 1053 nm. Other possible infra-red laser types include diode lasers emitting at 823 nm or diode lasers emitting at 985 nm. A series of lasers can be used arranged in a particular array. Important parameters of the laser recording are the spot diameter (D) measured at the $1/e^2$ value of the intensity, the applied laser power on the film (P), the recording speed of the laser beam (v) and the number of dots per inch (dpi).

As an alternative to laser exposure a thermal head can be used or a flash exposure in combination with a light to heat converting mask.

As a consequence of the production of heat at the exposed areas the polymer is thermally degraded. This is accompanied by a change in adhesion and/or cohesive forces in the thermosensitive layer(s) at the exposed parts. This change in adhesion and/or cohesive forces can be used to obtain a heat mode image. The following processing conditions can be used to obtain such an image.

A simple rub off treatment can be used to remove the thermally recorded areas. This can be done by rubbing with a cotton pad, by rubbing with a brush or by gumming. When this processing is used the thermal imaging element of the present invention can serve as an alternative for a conventional silver halide image setting film since the retained polymer in the non-exposed areas has a particular density in the UV and/or the visual region. To increase the density difference between exposed and non-exposed parts different additives can be used in the thermally active layer itself or in a layer adjacent to it. For increasing the UV density UV-absorbers or dyes with strongly absorb in the UV region can be used. To enhance the density in the visual range common dyes can be built in in one or more of the layers. In a preferred embodiment for use as image setting film carbon black is incorporated to increase the density contrast between exposed and non-exposed areas. In this embodiment the carbon black serves simultaneously as radiation to heat converting substance. When a sufficient density difference is obtained the image can be used as a master for the exposure of a printing plate or of an intermediate duplicating film.

In another preferred treatment of the exposed element a peel-apart system is used again based on a change of adhesion and/or change of cohesive strenght of the thermally active layer. Depending on the nature of the support and the amount of heat generated in the thermally active layer the adhesion to the support is changed to a certain degree after the thermal degradation. By using a cover sheet coated with a thermoadhesive layer exposed parts of the thermosensitive together with optionally present upper layers can be removed by using a lamination/delamination technique. Such techniques are described for other heat mode recording systems, e.g. in WO 88/04237 and European Patent Application appl. No. 93201858. Depending on the nature of the support and the imaging layer different applications can be envisaged: microfilm, master for PCB's, microlithography, master for printing plates, medical film, image setting film.

In still another way of processing the difference in adhesion can be used for a selective material transfer step to an acceptor element. Depending on the application different kinds of acceptor materials can be envisaged. In case of application as printing plate the acceptor is a hydrophilic lithographic support, e.g. an aluminium foil, or a sheet, e.g. a polyethylene terephthalate sheet covered with a hydrophylic layer based on polyvinylalcohol and hardened with hydrolized tetraalkyl orthosilicate, in combination with silicon oxide or titanium dioxide. For proofing systems an acceptor on the basis of paper can be chosen. For film applications an acceptor sheet analogous to the support of the thermal imaging element can be chosen.

Furtheron a wash-off type of processing can be used to obtain an image. Since the thermal degradation is accompanied by a differentiation in solubility non-solvents for the non-degraded polymer should be used. Again different applications can be envisaged.

In still another method of image formation there is no treatment at all. Due to the formation of nitrogen gas during thermal degradation of the polymer the light-scattering and, as a consequence, the density is increased in the exposed areas. In this way a negative image is obtained without post-exposure treatment usable e.g. as a micrographic image.

In a still further particular method of image formation a more complex layer arrangement is used. This method comprises the following steps:

(a) exposing information-wise a thermal imaging medium comprising, in order,
  (1) a support,
  (2) a layer containing a thermally degradable polymer chosen from the group consisting of the compounds according to formulas (I), (IIa), (IIb), (IIIa), (IIIb), (IV) and (V) described above,
  (3) an image forming layer containing an image forming substance and a radiation to heat converting compound, said compound being the same or different from said image forming substance,
  (4) a release layer,
  (5) a thermoadhesive layer,
(b) laminating by heating a stripping sheet to said thermoadhesive layer (5),
(c) peeling apart said support and said stripping sheet whereby in the exposed areas layers (3) to (5) are removed with said stripping sheet while layer (2) remains adhered to said support, whereas in the unexposed areas layers (2), (3) and at least part of layer (4) adhere to the support while the remaining part of layer (4) and layer (5) are removed with the stripping sheet thus forming a positive image on said support.

This particular embodiment of the present invention will now be described in detail.

Contrary to the previously described embodiments the thermally degradable polymer and the radiation to heat converting substance are not contained in the same layer. The image forming substance can be a pigment and the radiation to heat converting compound can be an infra-red absorbing compound like in the previously explained embodiments. However, in a most preferred embodiment of this particular method of image formation the image forming substance and the radiation to heat converting substance are one and the same compound, namely carbon black. It can be used in the amorphous or in the graphite form. The preferred average particle size of the carbon black ranges from 0.01 to 1 μm. Different commercial types of carbon black can be used, preferably with a very fine average particle size, e.g. RAVEN 5000 ULTRA II (Columbian Carbon Co.), CORAX L6, FARBRUSS FW 2000, SPEZIALSCHWARZ 5, SPEZIALSCWARZ 4A, SPEZIALSCHWARZ 250 and PRINTEX U (all from Degussa Co.). As binders for the image forming layer gelatin, polyvinylpyrrolidone, polyvinylalcohol, hydroxyethylcellulose, polyethyleneoxide and a broad variety of polymer latices can be considered. The preferred binder is gelatin. The preferred coverage of the image forming layer ranges between 0.5 and 5 g/m$^2$.

The release layer contains a binder and one or more of the typical ingredients for release layers known in the art such as waxes, polyethylene, silicones, fluorated polymers such as Teflon, silica particles (e.g. SEAHOSTAR KE types, Nippon Shokukai Co), colloidal silica, polymeric beads (e.g. polystyrene, polymethylmethacrylate), hollow polymeric core/shear beads (e.g. ROPAQUE particles, Rohm and Haas Co), beads of siliconised pigments like siliconised silica (e.g. TOSPEARL types, Toshiba Silicones Co), and matting agents. In a particularly preferred embodiment of the present invention the release layer contains a mixture of polyethylene and Teflon. The preferred coverage of the release layer ranges between 0.1 and 3 g/m$^2$.

For ecological and practical reasons the thermoadhesive layer (TAL) is preferably coated from an aqueous medium. Therefore the polymers are preferably incorporated as latices. The TAL preferably has a glass transition temperature $T_g$ between 20° C. and 60° C. Preferred latices are styrene-butadiene latices. These latices can contain other comonomers which improve the stability of the latex, such as acrylic acid, methacrylic acid and acrylamide. Other possible polymer latices include polyvinylacetate, copoly(ethylene-vinylacetate), copoly(acrylonitrile-butadiene-acrylic acid), copoly(styrene-butylacrylate), copoly(methylmethacrylate-butadiene), copoly(methylmethacrylate-butylmethacrylate), copoly(methylmethacrylate-ethylacrylate), copolyester(terephtalic acid-sulphoisophtalic acid-ethyleneglycol), copolyester(terephtalic acid-sulphoisophtalic acid-hexanediol-ethyleneglycol). Particularly suitable polymers for use in the TAL are the BAYSTAL polymer types, marketed by Bayer AG, which are on the basis of styrene-butadiene copolymers. Different types with different physical properties are available. The styrene content varies between 40 and 80 weight %, while the amount of butadiene varies between 60 and 20 weight %; optionally a few weight % (up to about 10 %) of acrylamide and/or acrylic acid can be present. Most suited are e.g. BAYSTAL KA 8558, BAYSTAL KA 8522, BAYSTAL S30R and BAYSTAL P1800 because they are not sticky at room temperature when used in a TAL.

The information-wise exposure to intense laser radiation can be performed through the support or through the coated side of the thermal imaging medium.

The stripping sheet can be chosen from the list of the same polymeric resins as usable for the support. Alternatively a paper base can be used, e.g. a plain paper base or a resin coated paper such as a polyethylene coated paper.

The lamination is preferably performed by conveying the thermal imaging medium and the stripping sheet together through a heated pair of rallers. The peeling apart (or delamination) can be performed by hand or by mechanical means. As a final result a positive carbon image is retained on the support.

The present invention will be illustrated by the following examples without however being limited thereto.

EXAMPLES

Example 1 (preparative example)

Synthesis of an azosulphide polymer.

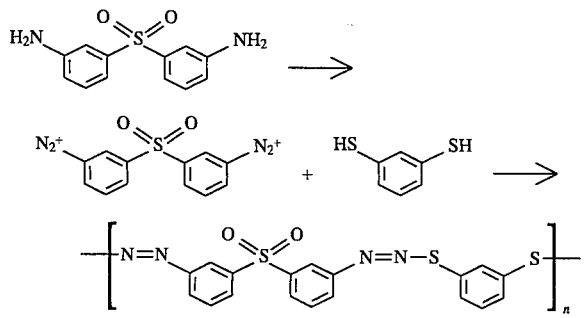

2.48 g of 3,3'-bisaminophenylsulphon (10 mmol) were suspended in 10 ml of destilled water. 18 ml of a 10 % solution of hydrochloric acid were added and the mixture was cooled to 0° C. Subsequently 1.38 g (20 mmol) of sodium nitrite were dissolved in 5 ml of destilled water and added dropwise. The mixture was stirred for 15 min at 0° C. Meanwhile 1.42 g of 1,3-dimercaptobenzene were dissolved in 100 ml of methylenechloride, cooled to 0° C. and dispersed in an icecold solution of 10.9 g of sodium acetate trihydrate in 120 ml of destilled water. Whilst stirring vehemently the diazonium salt solution was added dropwise to the organic-aqueous emulsion. The reaction mixture turned yellow immediately. Stirring continued for 30 min and then 100 ml of cold hexane was added in order to precipitate the swollen polymer. The yellow substance was collected by filtration and washed with 200 ml of water and 200 ml of methanol. Then the compound was dissolved in 200 ml of tetrahydrofuran, unsoluble substances were filtered off, and the polymer was precipitated in 2 l of hexane. Yield: 1.26 g or 0.5 %.

Characteristics:

Decomposition temp.: 138,4° C.

Maximal wavelenghts of absorption (in THF):
238 nm, $\epsilon_1=34540$ 1/mol cm
338 nm, $\epsilon_2=18440$ 1/mol cm Example 2 (preparative example)

To 200 ml of n.-hexane were added 0.005 mol (0,506 g) of distilled hexylamine and 0.015 mol (1.52 g) of triethylamin and the mixture was cooled to 0–5° C. An icecold solution of 0.005 mol of bisdiazonium-bistetrafluoroborate was rapidly added to the hexane solution whilst stirring vigorously. The polymer being formed is insoluble in both phases so that a polymer suspension is formed. After the end of the addition stirring was continued for another fifteen minutes. The polymer was collected by filtration. The residue was dissolved in tetrahydrofuran. The pentazadiene polymer was precipitated from this solution by pouring into n.-hexane. The precipitate was collected by filtration and dried in vacuo over diphosphorpentoxide. The yield was 63 %.

Example 3

0.25 g of thermodegradable polymer TPD-1 and 0.25 g of infra-red absorbing compound IRD-1 were dissolved in 9.5 g of dimethylformamide. This solution was coated onto a 100 µm thick subbed polyester terephthalate film with a 1.5 mil doctor blade (1 mil=25 µm) and dried for 30 minutes at 60° C. The film was exposed through the backside with a NdYLF laser (1053 nm). The power on the film was varied from 0.4 to 1.3 Watt.

At the highest power (1.3 Watt) the polymer degraded and the exposed pattern could be removed by a dry rub off treatment step with a cotton pad, leading to the formation of an image. The optical transmission density of this image was measured with a Macbeth densitometer 904TD equipped with a UV-filter. After rub off processing a density of 0.22 was measured at the exposed areas. In the non-exposed areas the the measured UV-density was 0.82.

Example 3bis

Instead of the infra-red absorbing dye of example 2 carbon black was used as IR-absorbing component. In this way an image serving as master in graphic arts was generated after exposing and dry rub off treatment.

Example 4

0.25 g of thermodegradable polymer TDP-2 and 0.25 g of IRD-2 were dissolved in 9.5 g DMF. This solution was coated onto a 100 µm thick subbed polyester terephthalate film with a 1.5 mil doctor blade and dried for 30 minutes at 60° C. The film was exposed through the backside with a NdYLF laser (1053 nm). The power on the film was varied from 0.4 to 1.3 Watt.

At the highest power (1.3 Watt) the polymer degraded and the exposed pattern could be removed by a dry rub off processing step with a cotton pad, leading to the formation of an image.

Example 4bis

Instead of the infra red absorbing dye of example 3 carbon black was used as IR-absorbing component. In this way an image serving as master in graphic arts was generated after exposing and dry rub off treatment.

Example 5

0.25 g of TDP-2 and 0.25 g of IRD-1 were dissolved in 9.5 g of DMF. This solution was coated onto a 100 µm subbed polyester terephthalate film with a 1.5 mil doctor blade and dried for 30 minutes at 60° C. The film was exposed through the frontside with a NdYLF laser (1053 nm). The power on the film was varied from 0.4 to 1.3 Watt.

The exposed pattern showed an increased light scattering intensity, leading to a density increase of 0.7 in the visible wavelength region. The increased light scattering originated from gas ($N_2$) formation. Under the microscope one could observe the gas vesicles formed in the exposed areas. In this way a microfilm pattern could be written onto the element.

Example 6

0.25 g of TDP-1 and 0.25 g of IRD-1 were dissolved in 9.5 of DMF. This solution was coated onto a 100 μm subbed polyester terephthalate film with a 1.5 mil doctor blade and dried for 30 minutes at 60° C. The film was exposed through the frontside with a NdYLF laser (1053 nm). The power on the film was varied from 0.4 to 1.3 Watt.

After laser exposure the element was subjected to a wash-off processing by means of methylethylketone in order to remove the exposed pattern. After this treatment the optical transmission density of this image was measured with a Macbeth densitometer 904TD equipped with a UV-filter. The Dmin in the exposed areas was 0.05. In the non-exposed areas the measured UV-density was 0.82.

Example 7

0.25 g of TDP-1 and 0.25 g of IRD-1 were dissolved in 9.5 of DMF. This solution was coated onto a 100 μm subbed polyester terephthalate film with a 1.5 mil doctor blade and dried for 30 minutes at 60° C. The film was exposed through the frontside with a NdYLF laser (1053 nm). The power on the film was varied from 0.4 to 1.3 Watt.

After laser exposure the heat mode recorded element was laminated at 90° C at a speed of 300 mm.min$^{-1}$ using a CODOR LAMIPACKER LPA330 to a thermoadhesive layer coated on a subbed 100 μm thick polyester base. This thermoadhesive layer was coated from a 50 % (w/w) BAYSTALL KA8522 emulsion (a thermoadhesive polymer on the basis of styrene-butadiene, marketed by Bayer, AG) by means of a 15 μm doctor blade and dried for 30 minutes at 60° C. giving rise to a dry thickness of approximately 7.5 μm.

Due to a decreased adhesion to the support, the exposed areas were removed with the thermoadhesive layer by a peel-apart treatment. The image retained on the support showed a Dmin (UV) of 0.24 and a Dmax of 0.81.

Example 8

Preparation of the donor sheet:

Onto a subbed polyethylene terephthalate support (thickness=100 μm) was coated a heat sensitive composition consisting of a solution in methylethylketone of 1.25 % by weight of infra-red absorbing dye (KU3-2052), 1.875 % by weight of a novolak (MILEX XL225 from Mitsui Toatsu Chemicals Inc.) and 1.875 % by weight of pentazadiene TPD-3 (see structure in the description). The mixture was coated to a wet thickness of 20 μm.

Preparation of the hydrophilic acceptor sheet:

To 440 g of a dispersion contg. 21.5% of $TiO_2$ (average particle size 0.3–0.5 μm) and 2.5 % of polyvinylalcohol in deionized water were subsequently added, while stirring, 250 g of a 5 % polyvinylalcohol solution in water, 105 g of a hydrolized 22 % tetramethyl orthosilicate emulsion in water and 12 g of a 10 % solution of a conventional wetting agent. To this mixture was added 193 g of deionized water and the pH was adjusted to pH=4. The obtained dispersion was coated on a polyethylene terephthalate film support having a thickness of 175 μm (having provided thereon a hydrophilic adhesion layer) giving rise to a wet coating thickness of 50 μm, dried at 30° C., and subsequently hardened by subjecting it to a temperature of 57° C. for 1 week.

Imaging and material transfer.

The donor sheet with the heat sensitive layer was placed in contact with the hydrophilic acceptor sheet. The obtained heat mode recording material was image-wise exposed using an infra-red laser (Nd-YLF emitting at 1053 nm: the power on the film was varied from 0.4 to 1.3 Watt) through the backside of the donor sheet. The infra-red/pentazadiene/novolak layer was blown away from the direction of the laser incidence into the receptor. After peeling apart complete transfer to the receptor was achieved with a power on the film of 1.2 Watt.

The hydrophilic support with the transferred image could be used as a printing plate.

Example 9

This example illustrates the particular embodiment wherein there is a separate carbon containing layer and a separate layer containing a thermally degradable polymer.

To a subbed polyethylene terephthalate film support (1) were coated in the order given (2) a layer containing a thermally degradable polymer (nitrogen producing), (3) a carbon black layer, (4) a release layer, (5) a thermoadhesive layer.

The composition of each of these layers is shown in table 1.

TABLE 1

| layer | compound: | (g/m$^2$) |
|---|---|---|
| (2) | polymer TDP-2 | 0.5 |
| (3) | carbon black (CORAX L6, Degussa Co) | 0.9 |
| | copoly(ethylacrylate-methylmethacrylate-methacrylic acid; 37.0/47/16) (pH = 9) | 0.72 |
| | conventional wetting agent | 0.38 |
| (4) | polyethylene (HORDAMMER PE02, marketed by Hoechst AG) | 0.25 |
| | teflon (HOSTAFLON TF5032, marketed by Hoechst AG) | 0.25 |
| (5) | copoly(styrene-butadiene-acrylic acid) (BAYSTAL KA8522, purchased from Bayer AG) | 25 |

The above prepared heat mode element is exposed information—wise, using a test pattern, through the polyester support by means of Nd-Yag solid state laser having an output power of 1.6 Watt and an emission wavelenght of 1064 nm. A test pattern was written at 212 lines per inch with an adressability of 2400 dots per inch.

A subbed polyethylene terephthalate cover sheet having a thickness of 100 μm was laminated to the thermoadhesive layer (5). A roller laminator (type LPP650 of the Dutch Dorned Co) was used. The roller temperature was 90° C. The lamination speed was 0.4 m/min. The pressure between the rollers corresponded to a impression of 1.5 mm.

On peeling-apart the support and the cover sheet, at the exposed areas of the test pattern, the thermoadhesive layer (5) together with the release layer (4) and the carbon layer (3) adhered to the stripping sheet, while the polymer layer (2) adhered to the PET support. In the non-exposed parts the polymer layer (2), the carbon containing layer (3) and a part of the release layer (4) adhered to the PET support, while the thermoadhesive layer (5) and the other part of the release layer (4) adhered to the cover sheet.

We claim:

1. Thermal imaging element comprising a support and at least one layer containing a radiation to heat converting substance and a thermally degradable polymer composed of recurring units represented by general formula (I):

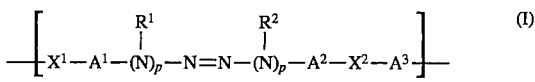

wherein, each of $A^1$, $A^2$ and $A^3$ independently represents an alkylene or an arylene group, each of $R^1$ and $R^2$ independently represents H, an alkylene, or an arylene group, each of $X^1$ and $X^2$ independently represents a divalent linking group chosen from the group consisting of —NHCO—, —CONH—, —OCO—, —S—, —NHCONH—, —NHCOO—, —OCONH—, —O—, and p=0 or 1.

2. Thermal imaging element comprising a support and at least one layer containing a radiation to heat converting substance and a thermally degradable polymer composed of recurring units represented by general formulas (IIa) or (IIb):

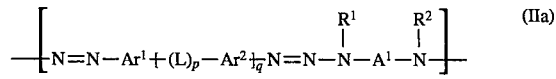

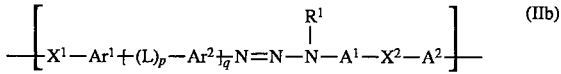

wherein, each of $Ar^1$ and $Ar^2$ independently represents an aromatic group,

L represents a divalent linking group chosen from the group consisting of —O—, —S—, —CO—, —SO$_2$—, $CZ^1Z^2$ wherein $Z^1$ and $Z^2$ each independently represents H, alkyl or the necessary atoms to close a cycloaliphatic ring, q=0 or 1, and the other symbols $R^1$ $R^2$ X and p have the same meaning as in formula (I) of claim 1.

3. Thermal imaging element comprising a support and at least one layer containing a radiation to heat converting substance and a thermally degradable polymer composed of recurring units represented by general formulas (IIIa) or (IIIb):

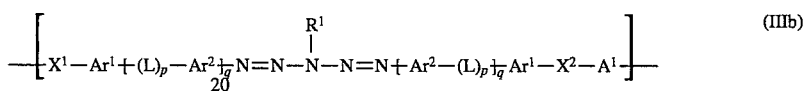

wherein the symbols $R^1$ $Ar^1$ $Ar^2$ L p and q have the same meaning as claim 2.

4. Thermal imaging element comprising a support and at least one layer containing a radiation to heat converting substance and a thermally degradable polymer composed of recurring units represented by general formula (IV):

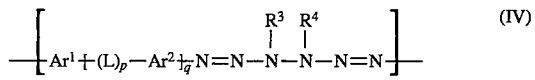

wherein the symbols $Ar^1$ $Ar^2$ L p and q have the same meaning as claim 2, and each of $R^3$ and $R^4$ independently represents H, an alkylene, an arylene, or an acylene group.

5. Thermal imaging element comprising a support and at least one layer containing a radiation to heat converting substance and a thermally degradable polymer composed of recurring units represented by general formula (V):

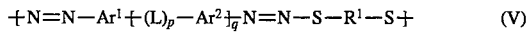

wherein the symbols $R^1$ $Ar^1$ $Ar^2$ L p and q have the same meaning as claim 2.

6. Thermal imaging element according to claim 1, 2, 3, 4 or 5 wherein said radiation to heat converting compound is an infrared absorbing compound.

7. Thermal imaging element according to claim 1, 2, 3, 4 or 5 wherein said radiation to heat converting compound is carbon black.

8. Thermal imaging element according to claim 1, 2, 3, 4 or 5 wherein said thermally degradable polymer and said radiation to heat converting substance are contained in one single layer.

9. Thermal imaging element according to claim 1, 2, 3, 4 or 5 wherein said at least one layer further contains a thermodegradable binder.

10. Thermal imaging element according to claim 9 wherein said thermodegradable binder is nitrocellulose.

* * * * *

UNITED STATES PATENT AND TRADEMARK OFFICE
CERTIFICATE OF CORRECTION

PATENT NO. : 5,506,085
DATED : April 9, 1996
INVENTOR(S) : Van Damme et al.

It is certified that error appears in the above-indentified patent and that said Letters Patent is hereby corrected as shown below:

<u>Column 4, line 53</u>, "-SO-" should read -- -SO$_2$- --;

<u>Column 5, line 59</u>, "Ar$^1$ Ar$^2$" should read --Ar$^1$, Ar$^2$--;

<u>Column 6, line 60</u>, "example" should read --example 1.--;

<u>Column 15, line 54</u>, "R$^1$ R$^2$" should read --R$^1$, R$^2$,--;

<u>Column 16, line 22</u>, "R$^1$ Ar$^1$ Ar$^2$ L" should read --R$^1$, Ar$^1$, Ar$^2$, L,--;

<u>Column 16, line 31</u>, "Ar$^1$ Ar$^2$ L" should read --Ar$^1$, Ar$^2$, L,--;

<u>Column 16, line 40</u>, "R$^1$ Ar$^1$ Ar$^2$ L" should read --R$^1$, Ar$^1$, Ar$^2$, L,--.

Signed and Sealed this

Tenth Day of September, 1996

Attest:

BRUCE LEHMAN

*Attesting Officer*     *Commissioner of Patents and Trademarks*